United States Patent [19]
Pauly

[11] Patent Number: 5,105,152
[45] Date of Patent: Apr. 14, 1992

[54] MAGNETIC RESONANCE IMAGING AND SPECTROSCOPY USING A LINEAR CLASS OF LARGE TIP-ANGLE SELECTIVE EXCITATION PULSES

[75] Inventor: John M. Pauly, Menlo Park, Calif.

[73] Assignee: The Board of Trustees of the Leland Stanford Junior University, Stanford, Calif.

[21] Appl. No.: 497,226

[22] Filed: Mar. 22, 1990

[51] Int. Cl.$^5$ ............................................. G01R 33/20
[52] U.S. Cl. ..................................... 324/309; 324/307
[58] Field of Search ............... 324/309, 307, 312, 313, 324/313, 314

[56] References Cited

U.S. PATENT DOCUMENTS

| | | | |
|---|---|---|---|
| 4,672,319 | 1/1987 | Nishimura | 324/309 |
| 4,985,677 | 1/1991 | Pauly | 324/309 |
| 4,999,580 | 3/1991 | Meyer et al. | 324/309 |

Primary Examiner—Hezron E. Williams
Assistant Examiner—Louis M. Arana
Attorney, Agent, or Firm—Townsend and Townsend

[57] ABSTRACT

Disclosed is a method of generating a linear large tip-angle selective excitation pulse for magnetic resonance imaging using a linear Fourier transform analysis. An inherently refocused small tip-angle excitation pulse which produces a rotation about an axis is first defined. Then a sequence of the small tip-angle excitation pulses is produced and concatenated whereby the sum of the tip angles produced by the sequence of pulses results in a desired net large tip-angle. The small tip-angle pulses have a Hermitian RF weighted k-space trajectory. The tip angle is the Fourier transform of the weighted k-space trajectory.

4 Claims, 10 Drawing Sheets k-SPACE TRAJECTORY     APPROXIMATE DECOMPOSITION INTO INHERENTLY REFOCUSED PULSES

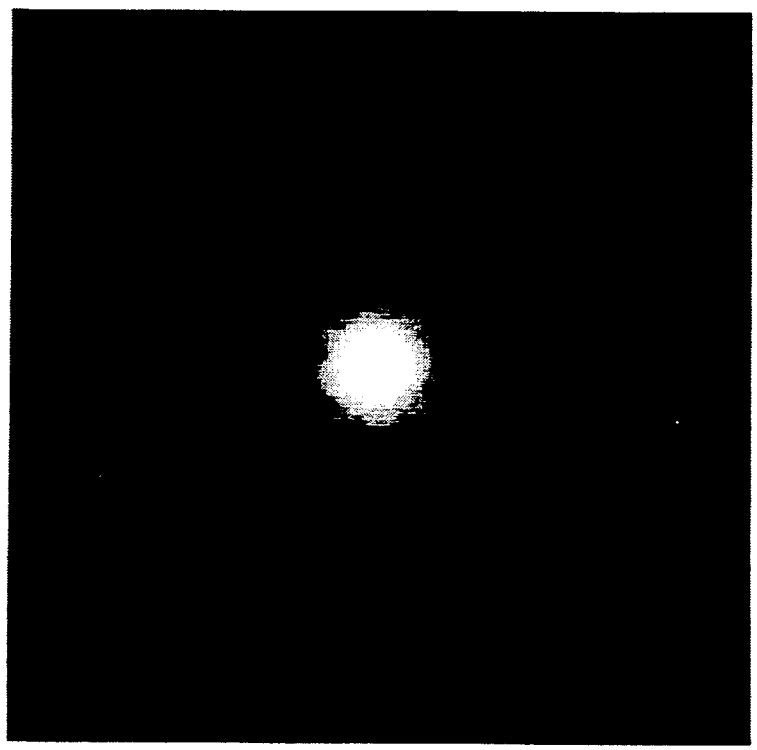
$|M_y|$
FIG._12B
$|M_x|$
FIG._12A

MAGNETIC RESONANCE IMAGING AND SPECTROSCOPY USING A LINEAR CLASS OF LARGE TIP-ANGLE SELECTIVE EXCITATION PULSES

The U.S. Government has rights in the disclosed invention pursuant to National Institute of Health grant #1R01HL34962 to Stanford University.

BACKGROUND OF THE INVENTION

This invention relates generally to magnetic resonance imaging (MRI) and spectroscopy, and more particularly the invention relates to MRI using a linear class of large tip-angle selective excitation pulses.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the *IEEE Transactions on Nuclear Science*, Vol. NS-27, pp. 1220–1255. The basic concepts are described in the lead article, "Introduction to the Principles of NMR," by W. V. House, pp.1220–1226, which employ computed tomography reconstruction concepts for reconstructing cross-sectional images. A number of two- and three-dimensional imaging methods are described. Medical applications of NMR are discussed by Pykett in "NMR Imaging in Medicine," *Scientific American*, May 1982, pp.78–88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field $B_o$, and the so-called gyromagnetic ratio, $\gamma$, a fundamental physical constant for each nuclear species:

$$\omega_o = B_o \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

For a number of imaging applications one would like to selectively examine a particular spatial slice and a particular spectral component of the object at the same time. The most important example of this is two-dimensional water/fat imaging. Water/fat imaging may be desirable as an end in itself, for example as a tool for examining atherosclerotic plaque. It may also be desirable to select for water or fat in order to avoid image artifacts, such as those encountered in rapid imaging sequences. Rapid imaging sequences based on steady-state free precession suffer from artifacts at water/fat boundaries. Rapid k-space scanning sequences can suffer intolerable shifts or blurring of either water or fat.

Many techniques for forming water/fat images using spectrally-selective excitation sequences have been studied. Most of these techniques combine a spatially-selective pulse with an additional spectrally-selective pulse; however, multi-slice acquisition is impossible with these techniques. One recent technique uses two offset spatially-selective pulses. However, for many applications a single pulse that is simultaneously spectrally selective and spatially selective would be preferable to a combination of pulses.

A k-space interpretation of small-tip excitation is given by Pauly, Nishimura, and Macovski in "A k-space Analysis of Small-Tip-Angle Excitation," *Journal of Magnetic Resonance* 81, 43–56 (1989). The present invention uses this k-space interpretation of small-tip-angle excitation to design a linear class of large tip-angle selective excitation pulses.

SUMMARY OF THE INVENTION

An object of the present invention is magnetic resonance imaging using a linear class of large tip-angle selective excitation pulses.

Still another object of the invention is an improved method of linearly designing large tip-angle selective excitation pulses.

Briefly, the design of linear large tip angle selective excitation pulses uses the k-space given by Pauly et al., supra. For an inherently refocused large tip angle pulse, a plurality of inherently refocused small-excitation pulses can be concatenated. The tip angle produced by a sequence of inherently refocused small-excitation pulses is the linear sum of their individual tip angles. The individual tip angles are the Fourier transform of each pulse's k-space trajectory weighted by the applied RF. Because the Fourier transform is a linear operator, the entire sequence of pulses may be considered one pulse with the concatenated k-space trajectory and RF weighting. This allows large tip angle pulses to be designed directly provided the component pulses satisfy the small-excitation approximation. The design procedure is exactly the same as in the small-tip-angle case, with the tip angle substituted for the transverse magnetization as the objective function.

The invention and objects and features thereof will be more readily apparent from the following detailed description and appended claims when taken with the drawing.

BRIEF DESCRIPTION OF THE DRAWINGS

FIGS. 12A and 12B illustrate the magnitude of the real and imaginary parts of an experimental image obtained with the pulse sequence of FIG. 11.

DETAILED DESCRIPTION OF ILLUSTRATIVE EMBODIMENTS

Figure 1A:
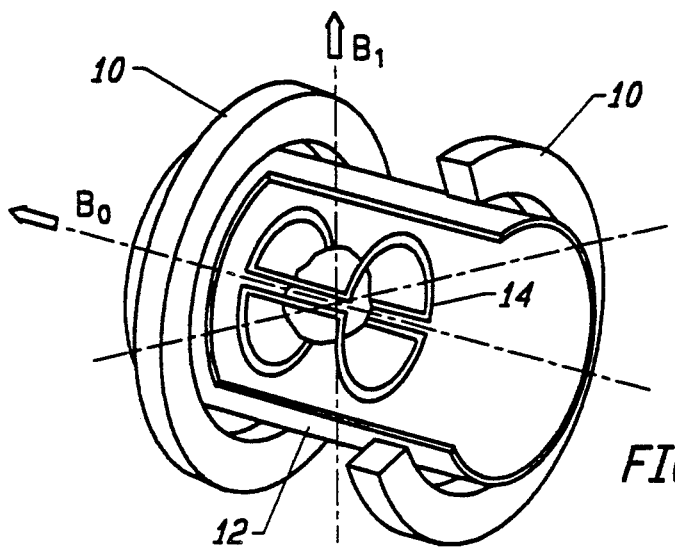
FIGS. 1A–1D illustrate the arrangement of conventional MRI apparatus and magnetic fields generated therein.
Figures 1B, 1C, 1D:
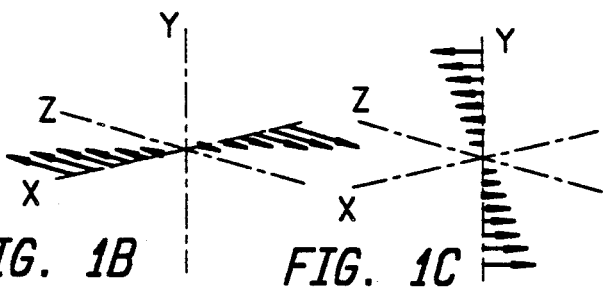

Referring now to the drawing, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
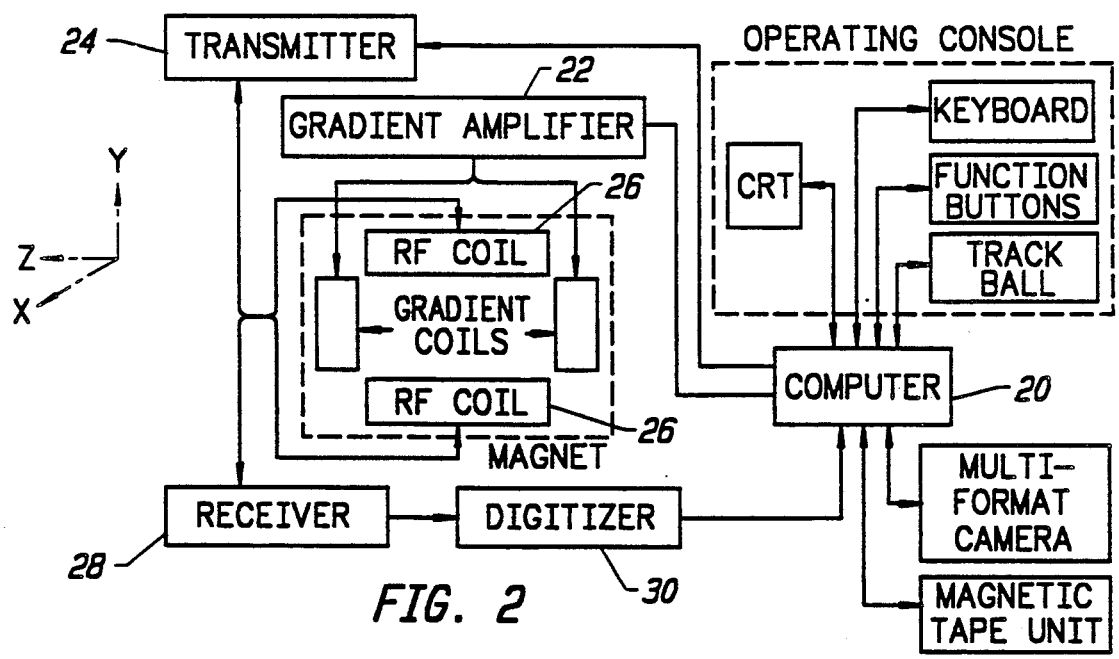
FIG. 2 is a functional block diagram of MRI imaging apparatus.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
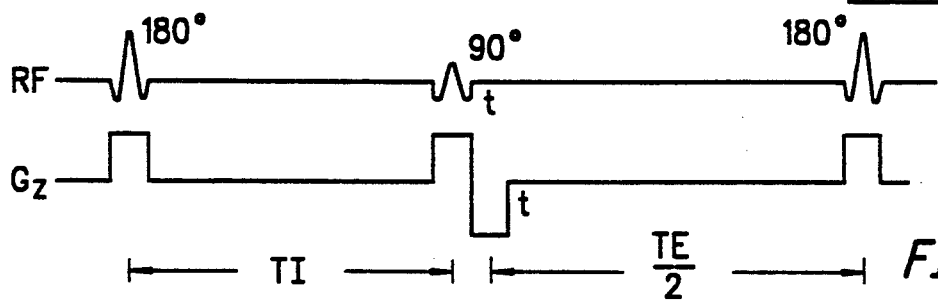
FIG. 3 illustrates a conventional basic pulse sequence for imaging.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween. From this representation, it can be seen that the angle of flip is proportional to the area under the pulse.

In accordance with the present invention, the k-space interpretation of small-tip-angle excitation disclosed by Pauly et al., supra, is utilized in designing a linear class of large tip-angle selective excitation pulses.

Pauly et al. introduced a k-space interpretation of small-tip-angle selective excitation. They showed that multi-dimensional selective excitation in the presence of time-varying gradients can be analyzed using Fourier transform theory. Using this interpretation, they designed and implemented selective excitation pulses that are selective in two spatial dimensions. Based on a small-tip-angle approximation, selective excitation is interpreted as a weighted trajectory through k-space. The slice profile is the Fourier transform of this weighted trajectory. The new excitation pulse may also be viewed as the consequence of the symmetries of the Bloch equation.

In accordance with the present invention it has been determined that these pulses continue to work well at large tip angles. This investigation leads to a general class of selective excitation pulses that may be designed based on a k-space analysis, and are valid at any tip angle.

The analysis is based on a generalization of the small-tip-angle solution for selective excitation. The small-tip-angle solution assumes that the initial magnetization is along the +z axis, and is only tipped through a small angle by the excitation pulse. The generalization is a solution for the rotation matrix based on a small-excitation approximation. Here the initial magnetization is arbitrary, and the angle between the initial and final magnetization may be large. However, the effect of the RF excitation is assumed to be small. It reduces to the small-tip-angle excitation as a special case.

This small-excitation approximation is then applied to the e special case of inherently refocused pulses, introduced by Pauly et al. These are pulses that have a Hermitian RF weighted k-space trajectory, with the trajectory starting at the origin. No refocusing gradient need follow the excitation. In the small-excitation regime an inherently refocused pulse produces a rotation about the axis along which the RF is applied. The tip angle is the Fourier transform of the weighted k-space trajectory.

These inherently refocused small-excitation pulses may be concatenated to produce large tip-angle excitation pulses. Two rotations about the same axis add linearly. The tip angle produced by a sequence of inherently refocused small-excitation pulses is the linear sum of their individual tip angles. The individual tip angles are the Fourier transform of each pulse's k-space trajectory weighted by the applied RF. Because the Fourier transform is a linear operator, the entire sequence of pulses may be considered one pulse with the concatenated k-space trajectory and RF weighting. This allows large tip angle pulses to be designed directly provided the component pulses satisfy the small-excitation approximation. The design procedure is exactly the same as in the small-tip-angle case, with the tip angle substituted for the transverse magnetization as the objective function.

First consider an extension of the small-tip-angle solution of Pauly et al., supra to a small-excitation solution. The small-tip-angle solution assumes both that the effect of the RF is small, and that the magnetization is initially along the +z axis. The resulting magnetization is then within some small angle of the +z axis, hence the name small-tip-angle. The small-excitation solution differs in that it assumes only that the effect of the RF is small, and does not make any assumption about the initial magnetization. Here the angle between the initial and final magnetizations may be large. Both solutions are essentially first order perturbation solutions.

The small-excitation solution is based on the spin domain treatment of magnetic resonance. The power of spin domain methods lies in the fact that rather than calculating the magnetization vector as a function of time, the rotation matrix itself is calculated. The rotation matrix is determined by two complex parameters, $\alpha$ and $\beta$, the Cayley-Klein parameters. A rotation by an angle $\phi$ about an axis $n=(n_x, n_y, n_z)$ corresponds to Cayley-Klein parameters $$\alpha = \cos\frac{\phi}{2} + in_z \sin\frac{\phi}{2} \quad [1]$$

$$\beta = i(n_x - in_y)\sin\frac{\phi}{2}. \quad [2]$$

Given an $\alpha$ and $\beta$, n and $\phi$ can be determined. This definition of the Cayley-Klein parameters differs in that we have taken left handed rotations to be positive. The is done so that a positive area RF pulse will produce a positive rotation.

In the spin domain a rotation corresponds to multiplication by a matrix $$Q = \begin{pmatrix} \alpha & \beta \\ -\beta^* & \alpha^* \end{pmatrix}, \quad [3]$$

where "*" denotes complex conjugate. This rotation matrix itself satisfies a spin-domain version of the Bloch equation (neglecting $T_1$ and $T_2$), $$\dot{Q} = \frac{i\gamma}{2}\begin{pmatrix} G\cdot x & B_1^* \\ B_1 & -G\cdot x \end{pmatrix} Q. \quad [4]$$

G is the vector gradient filed, x is the spatial position vector, and $B_1 = B_{1,x} + iB_{1,y}$ is the applied RF field. This equation is in a reference frame rotating at the Larmor frequency. Two coupled differential equations for $\alpha$ and $\beta$ may be extracted $$\begin{pmatrix} \dot{\beta} \\ \dot{\alpha}^* \end{pmatrix} = \frac{i\gamma}{2}\begin{pmatrix} G\cdot x & B_1^* \\ B_1 & -G\cdot x \end{pmatrix}\begin{pmatrix} \beta \\ \alpha^* \end{pmatrix}. \quad [5]$$

We first consider the $\alpha^*$ equation, $$\dot{\alpha}^* = \frac{i\gamma}{2}(B_1\beta - G\cdot x\alpha^*). \quad [6]$$

Here we make the small-excitation approximation. We assume that $B_1$ is small. The prior art makes the same approximation when analyzing the relation between the spectrum of an RF pulse and the excitation produced at a particular off-resonance frequency. Using this approximation the $\alpha^*$ equation reduces to $$\dot{\alpha}^* + \left(\frac{i\gamma}{2}G\cdot x\right)\alpha^* = 0. \quad [7]$$

The solution for $\alpha^*$ is $$\alpha^*(t) = \alpha_o^* e^{-\frac{i\gamma}{2}x\cdot\int_0^t G(s)ds} \quad [8]$$

$$= e^{-\frac{i\gamma}{2}x\cdot\int_0^t G(s)ds}. \quad [9]$$

The initial condition $\alpha_o$ is evaluated from Eq. 2 using the fact that $\phi$ is initially zero, so $\alpha_o = 1$. Using this expression for $\alpha^*$ we can solve the $\beta$ equation, $$\dot{\beta} = \frac{i\gamma}{2}(G\cdot x\beta + B_1^*\alpha^*). \quad [10]$$

The solution is $$\beta(T) = \frac{i\gamma}{2}e^{-\frac{i\gamma}{2}x\cdot\int_0^T G(s)ds}\int_0^T B_1^*(t)e^{-i\gamma x\cdot\int_t^T G(s)ds}dt + \quad [11]$$

$$\beta_o e^{\frac{i\gamma}{2}x\cdot\int_0^T G(s)ds}$$

$$= \frac{i\gamma}{2}e^{-\frac{i\gamma}{2}x\cdot\int_0^T G(s)ds}\int_0^T B_1^*(t)e^{-i\gamma x\cdot\int_t^T G(s)ds}dt \quad [12]$$

where $\beta_o$ is 0 because $\phi$ is initially zero. We define a spatial frequency variable $$k(t) = -\gamma \int_t^T G(s)ds. \quad [13]$$

The small-excitation solution for the Cayley-Klein parameters can then be written $$\alpha^*(T) = e^{\frac{i}{2}x\cdot k(0)} \quad [14]$$

$$\beta(T) = \frac{i\gamma}{2} e^{\frac{i}{2} x \cdot k(0)} \int_0^T B_1^*(t) e^{-ix \cdot k(t)} dt. \quad [15]$$

The $\beta$ equation is a parametric equivalent to a Fourier transform. If we assume that the k-space trajectory does not cross itself and that $$\frac{B_1^*(t)}{|\dot{k}(t)|}$$

is finite, we can write the $\beta$ equation as a Fourier transform of spatial frequency $$\beta(x) = \frac{i\gamma}{2} e^{\frac{i}{2} x \cdot k(0)} \int_K W(k) S(k) e^{-ix \cdot k} dk. \quad [16]$$

W(k) is the spatial frequency weighting function $$W(k(t)) = \frac{B_1^*(t)}{|\dot{k}(t)|} \quad [17]$$

where W(k) is left unspecified for k not on the k-trajectory. S(k) is the spatial frequency sampling function, and is a unit weight representation of the k-space trajectory. It may be written $$S(k) = \int_0^T {}^3\delta(k(t) - k)|\dot{k}(t)|dt \quad [18]$$

where $^3\delta$ (k) is a three dimensional delta function. For a very closely related derivation see Pauly et al., supra. Hereafter, we will simply refer to parametric equations of the type of Eq. 15 as Fourier transforms, not explicitly casting them in the spatial frequency Fourier transform form of Eq. 16.

Before proceeding we will show that this solution to the Bloch equation includes the small-tip-angle solution. Given the Cayley-Klein parameters the rotation produced by a excitation pulse may be written $$\begin{pmatrix} M_{xy}^+ \\ M_{xy}^{+*} \\ M_z^+ \end{pmatrix} = \begin{pmatrix} (\alpha^*)^2 & -(\beta^*)^2 & -2\alpha^*\beta^* \\ -\beta^2 & \alpha^2 & -2\alpha\beta \\ \alpha^*\beta & \alpha\beta^* & \alpha\alpha^* - \beta\beta^* \end{pmatrix} \begin{pmatrix} M_{xy}^- \\ M_{xy}^{-*} \\ M_z^- \end{pmatrix} \quad [19]$$

where the "−" and "+" superscripts refer to times immediately preceding and following the excitation, and $M_{xy} = M_x + iM_y$. If the magnetization is initially aligned with the +z axis, $$(M_{xy}^-, M_{xy}^{-*}, M_z^-) = (0, 0, M_o). \quad [20]$$

The resulting transverse magnetization is then $$M_{xy}^+ = -2\alpha^*\beta^* M_o \quad [21]$$

$$= i\gamma M_o \int_0^T B_1(t) e^{ix \cdot k(t)} dt. \quad [22]$$

This is the same as the result given in Pauly et al., supra.

Next we consider the special case of inherently refocused pulses. These are pulses that have Hermitian weighted k-space trajectories that start at the origin. The Hermitian symmetry means that for every point on the k-space trajectory there is another point symmetric about the origin with the conjugate weighting. Note that because of the way k(t) is defined in Eq. 13, the k-trajectory necessarily ends at the origin: the endpoint defines the origin.

Figure 4:
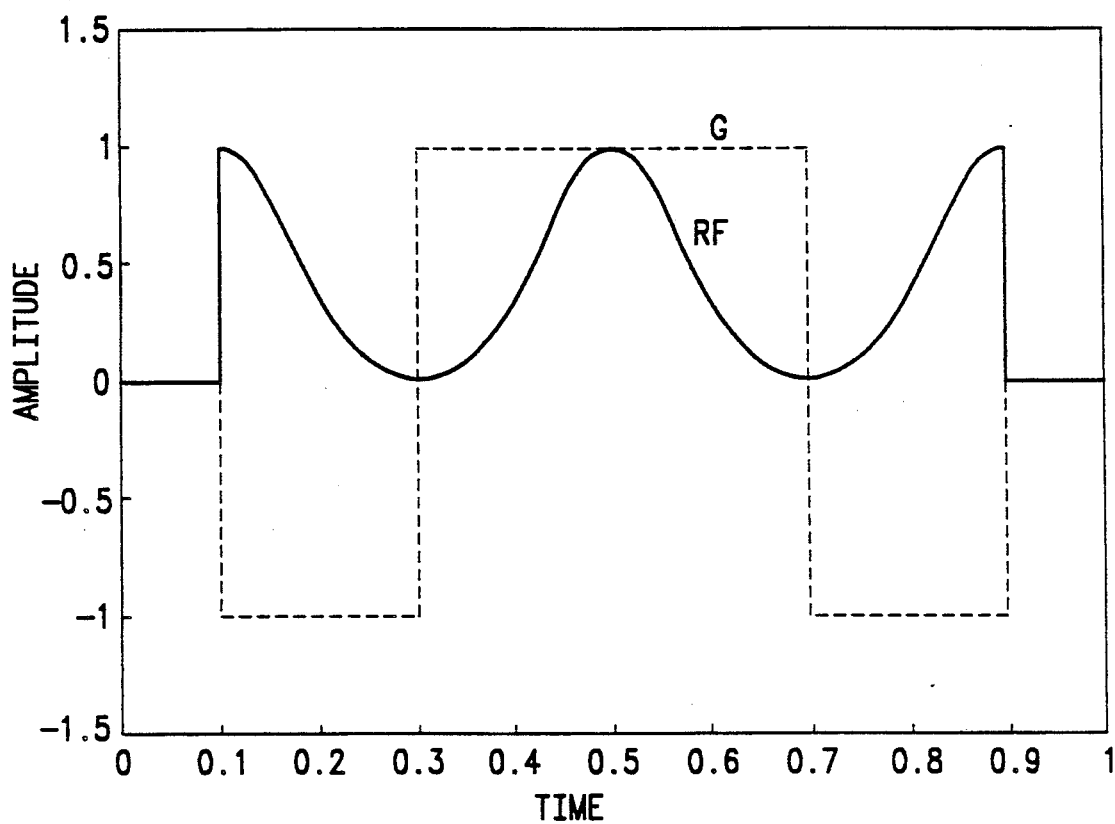
FIG. 4 is a plot of an inherently refocused slice selective excitation pulse.
Figure 5:
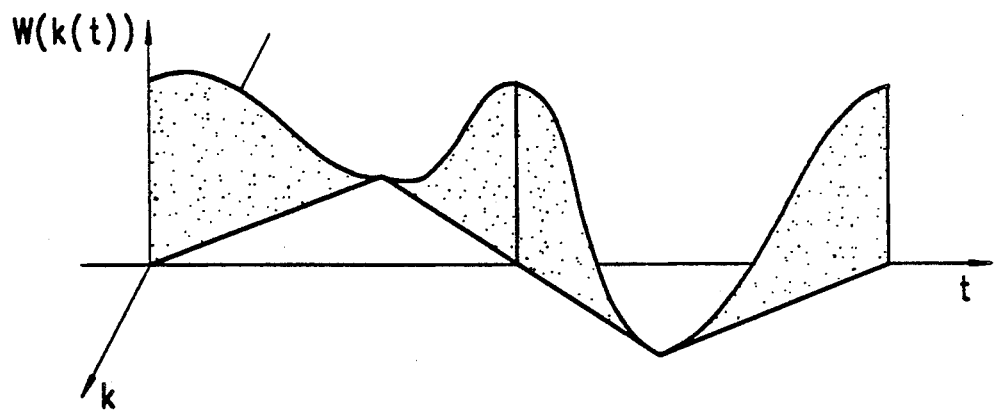
FIG. 5 is the k-space trajectory and weighting for the pulse in FIG. 4, shown as a function of time.

A one-dimensional (slice-selective) example is shown in FIG. 4. For an inherently refocused pulse $$k(0) = -\gamma \int_0^T G(t) dt = 0. \quad [23]$$

Because of the Hermitian symmetry of $B_1(t)$ along k(t) the Fourier transform $$\frac{\gamma}{2} \int_0^T B_1^*(t) e^{-ix \cdot k(t)} dt \quad [24]$$

is real. Referring back to Eqs. 14 and 15 we see that $$\alpha^*(T) = 1 \quad [25]$$

$$\beta(T) = \frac{i\gamma}{2} \int_0^T B_1^*(t) e^{-ix \cdot k(t)} dt \quad [26]$$

$$= \text{imaginary function of } x. \quad [27]$$

Referring back to Eq. 2 we see that a real $\alpha$ means that $n_z = 0$, and an imaginary $\beta$ means that $n_y = 0$. The Rotation axis is then $$n = (1, 0, 0), \quad [28]$$

and is not a function of x. At all points in space the magnetization vector rotates about the same axis. Again referring to Eq. 2, $\beta = i \sin \phi/2$. Since $\phi/2 \approx \sin \phi/2$ for $\phi/2$ small, $\phi$ may be approximated $$\phi \approx 2\sin\frac{\phi}{2} \quad [29]$$

$$= \frac{2}{i} \beta \quad [30]$$

$$= \gamma \int_0^T B_1^*(t) e^{-ix \cdot k(t)} dt. \quad [31]$$

This is the result we need. A small-excitation inherently refocused pulse results in a rotation about the axis of the applied RF, with the rotation angle being the Fourier transform of the RF weighted k-space trajectory.

As an example we have simulated the application of the inherently refocused pulse of FIG. 4 to initial magnetizations along each the +z, +y, and the +x axes. This demonstrates that the small-excitation solution applies irrespective of the initial magnetization. The RF is applied along the +x axis. The size of the rotation is the Fourier transform of the k-space weighting. In the case the RF weighting is a Gaussian function of spatial frequency, so the tip angle will be a Gaussian function of position. The RF has been scaled to produce a 30° tip angle on resonance.

In the first case the initial magnetization lies along the +z axis, which means we are also in the small-tip-angle regime. In this geometry $M_y$ is proportional to the tip angle. The result is plotted in FIG. 6A. $M_y$, and hence the tip angle, is Gaussian, while $M_x = 0$.

The next case, with initial magnetization along $+y$, is the most interesting. Here only the small-excitation solution applies. In this case $-M_z$ is proportional to the tip angle. The result is shown in FIG. 6B $-M_z$ is a Gaussian function of position, while $M_x$ is initially zero and remains zero.

The third case is of an initial magnetization along the $+x$ axis. Since this is the axis along which the RF is applied we expect the pulse to have no effect. This is in fact what is observed, as is shown in FIG. 6C.

Finally, for sake of comparison, we show the effect of a conventional slice selective excitation pulse when the initial magnetization is along the $+y$ axis. This excitation pulse is the same as that in FIG. 4, but with no initial negative gradient lobe, no RF during the final negative gradient lobe, and twice the RF during the positive gradient lobe. The result is plotted in FIG. 6D. This shows that pulses designed based on the small-tip-angle approximation do not work for this initial magnetization.

Figure 6A:
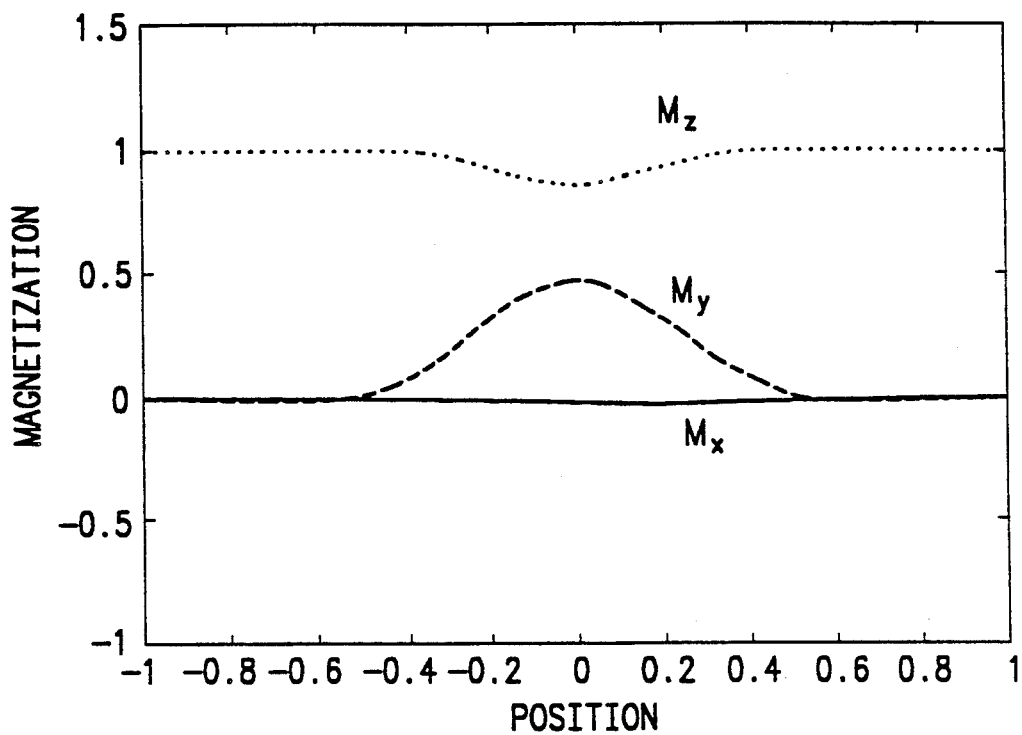
FIGS. 6A–6D are plots of magnetization resulting from the inherently refocused pulse of FIG. 4 applied to a magnetization vector initially along the a) +z axis, b) +y axis, c) the +z axis and d) is the result of applying a conventional slice selective excitation to a magnetization vector initially along the +y axis.
Figure 6B:
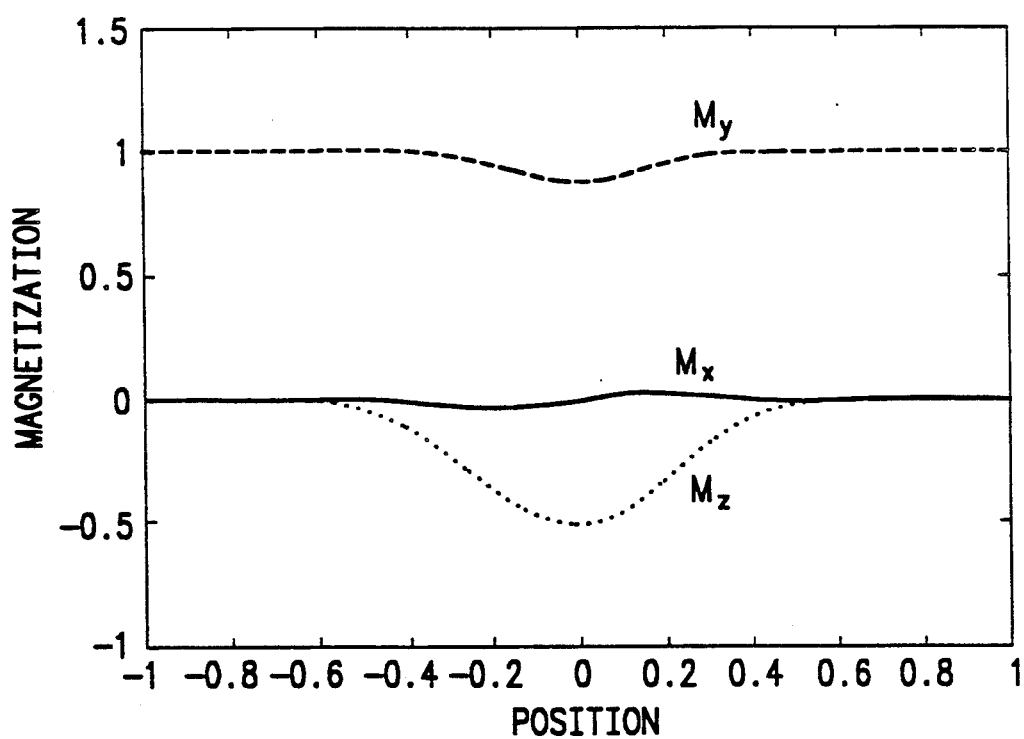
Figure 6C:
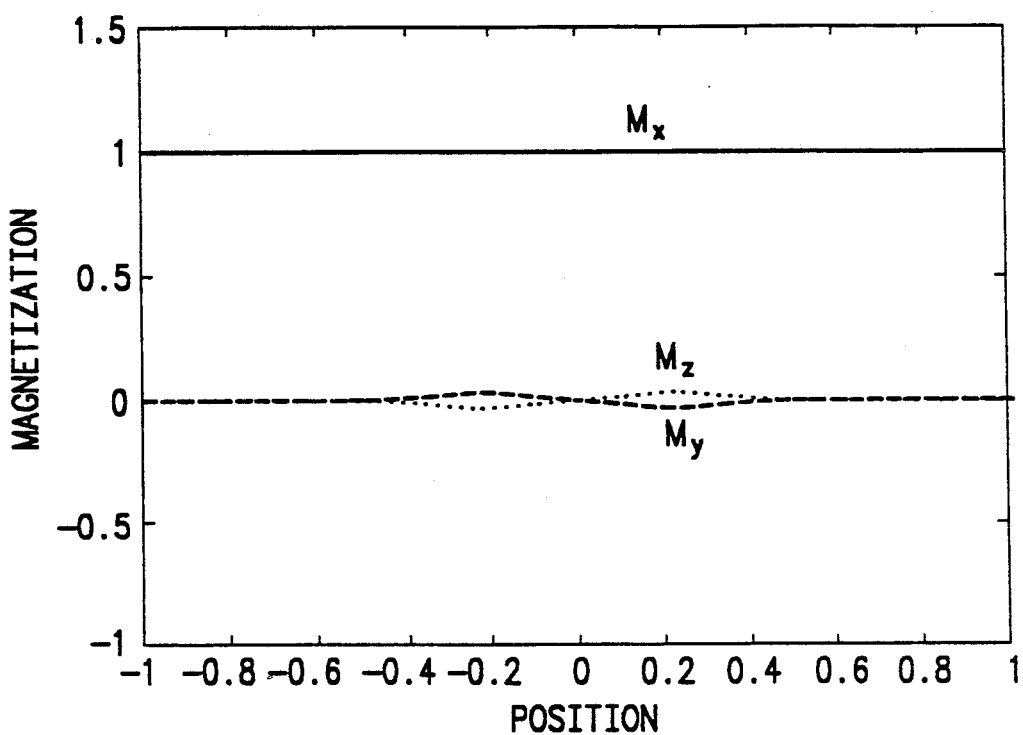
Figure 6D:
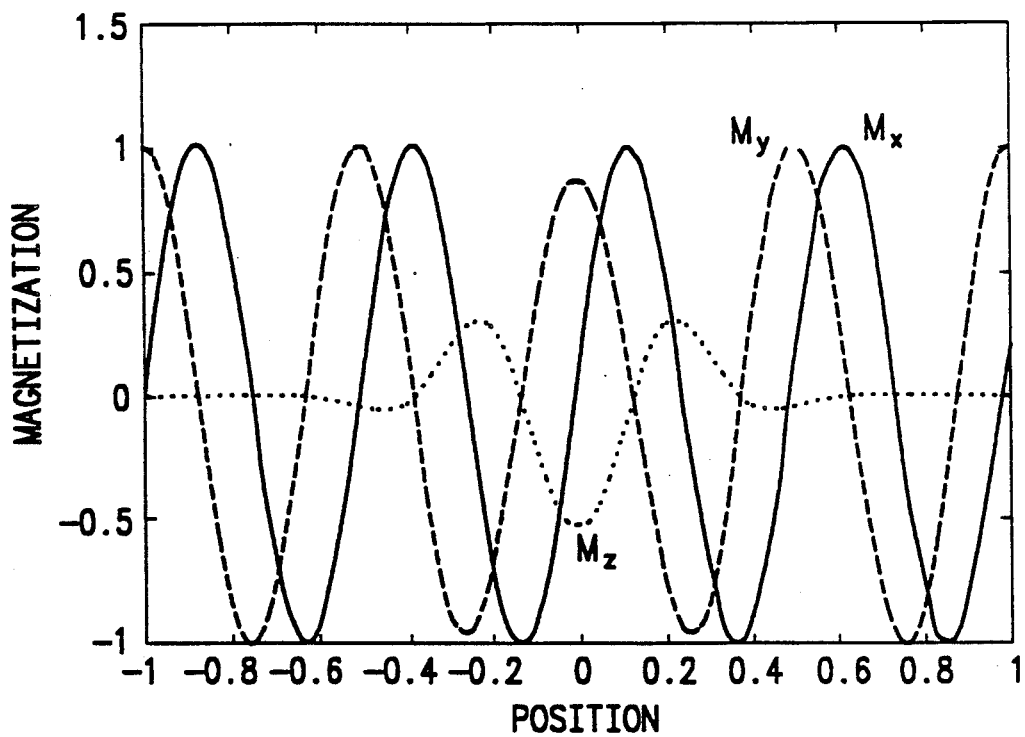
Figure 7A:
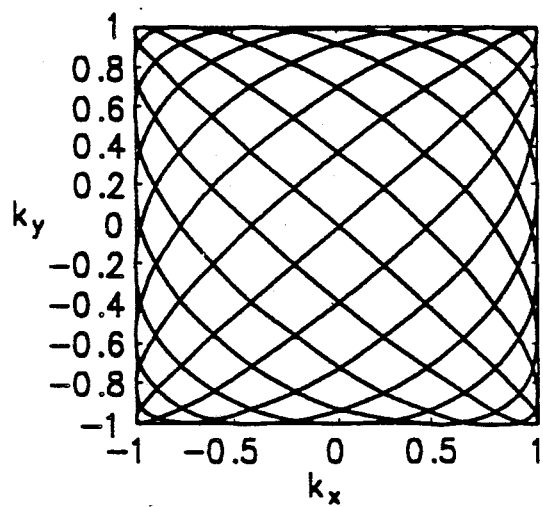
FIGS. 7A–7D illustrate different k-space trajectories which can be approximately decomposed into inherently refocused component trajectories including a) a Lissajous, b) a round spiral, c) a square spiral, and d) projection-reconstruction.
Figure 7B:
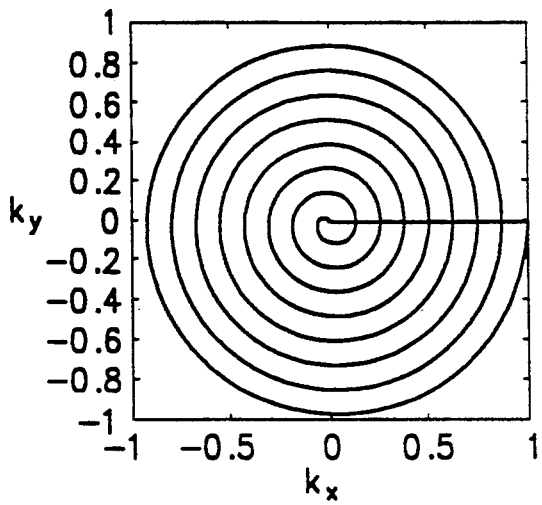
Figure 7C:
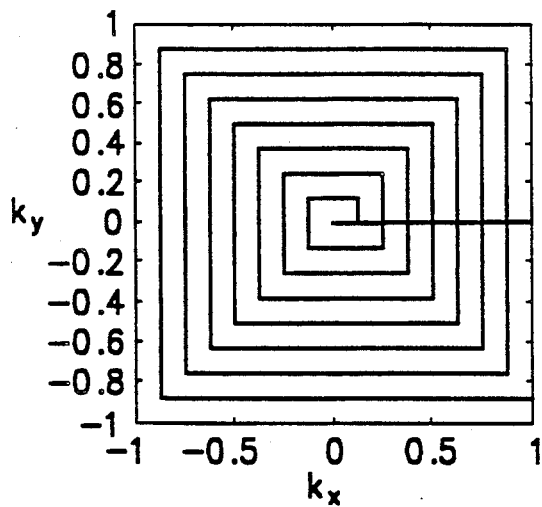
Figure 7D:
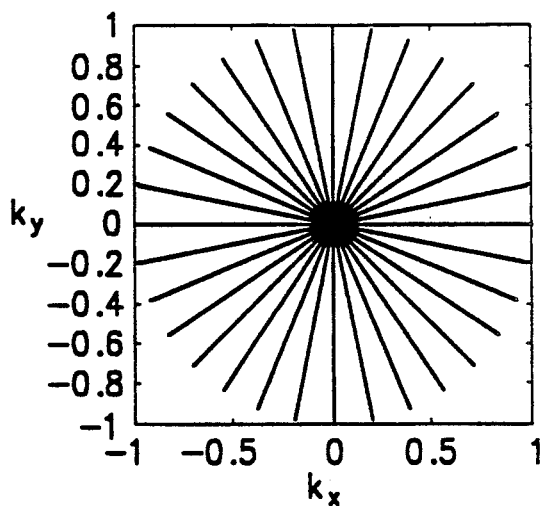

FIGS. 6A–6C show that the small-excitation inherently refocused pulse does produce a rotation about the $+x$ axis. The rotation axis is spatially invariant. The rotation angle is the Fourier transform of the weighted k-space trajectory. In this example the RF was scaled to produce a 30° tip angle on resonance. Although this is about the practical limit for the small-tip-angle solution, the inherently refocused pulse performs very well. Almost no $M_x$ magnetization is created if none exists initially, while all the $M_x$ present initially is preserved. This implies that the small-excitation approximation for inherently refocused pulses is fairly robust.

The results of the previous section lead directly to the synthesis of large-tip-angle pulses through the concatenation of a sequence of small-excitation pulses. The key is that each small-excitation pulse produces a rotation about the axis along which it is applied. If this axis is the same for each in a sequence of small-excitation pulses, the total tip angle for the concatenated pulses is simply the sum of the tip angles produced by the individual pulses.

To state this more formally, assume we have an excitation pulse that may be broken up into a sequence of n small-excitation inherently refocused pulses. The rotation produced by the $j^{th}$ pulse is $$\phi_j = \gamma \int_{T_{j-1}}^{T_j} B_1^*(t) e^{-i x \cdot k_j(t)} dt \quad [32]$$

where the $j^{th}$ pulse starts at time $T_{j-1}$ and ends at $T_j$, and where $k_j(t)$ is defined as $$k_j(t) = -\gamma \int_t^{T_j} G(s) ds \quad [33]$$

The tip angle resulting from the concatenation of pulses is $$\phi = \sum_{j=1}^{n} \phi_j \quad [34]$$

$$= \sum_{j=1}^{n} \gamma \int_{T_{j-1}}^{T_j} B_1^*(t) e^{-i x \cdot k_j(t)} dt \quad [35]$$

$$= \gamma \int_0^T B_1^*(t) e^{-i x \cdot k(t)} dt. \quad [36]$$

The last equality follows because each $k_j(t)$ starts and ends at the k-space origin, so that the concatenation of the $k_j(t)$'s is $k(t)$. This equation shows that if an excitation pulse can be decomposed into a sequence of small-excitation inherently refocused pulses, the tip angle produced by the pulse is the transform of the RF weighted k-space trajectory. This result continues to hold for any tip angle.

It should be noted that these large-tip-angle pulses can be translated in the same manner as the small-tip-angle pulses. To shift to a position $x_o$ the RF is modulated by $e^{-i x_o \cdot k(t)}$, $$\phi = \gamma \int_0^T B_1^*(t) e^{i x_o \cdot k(t)} e^{-i x \cdot k(t)} dt \quad [37]$$

$$= \gamma \int_0^T B_1^*(t) e^{-i(x-x_o) \cdot k(t)} dt. \quad [38]$$

$B_1^*(t)$ and $e^{-i x_o \cdot k(t)}$ are each Hermitian along the trajectory $k(t)$, so their product is also Hermitian along this trajectory. Each of the component pulses is still inherently refocused, and the large-tip-angle synthesis is still valid.

To illustrate the principles of the previous sections we will consider the design of a two-dimensional selective spin-echo, or time reversal pulse.

Many possible k-space trajectories can be used. These include most of the trajectories that have been proposed for acquiring and reconstructing an image from a single FID. Several of these are shown in FIG. 7. These include a) Lissajous trajectories produced by two cosine gradients with sightly different frequencies, round spirals of various sorts, square spirals, and projection-reconstruction trajectories. The basic requirement is that the trajectory be decomposable into segments that are at least approximately inherently refocused. One well known trajectory that does not meet this requirement is the echo-planar trajectory.

Figure 8:
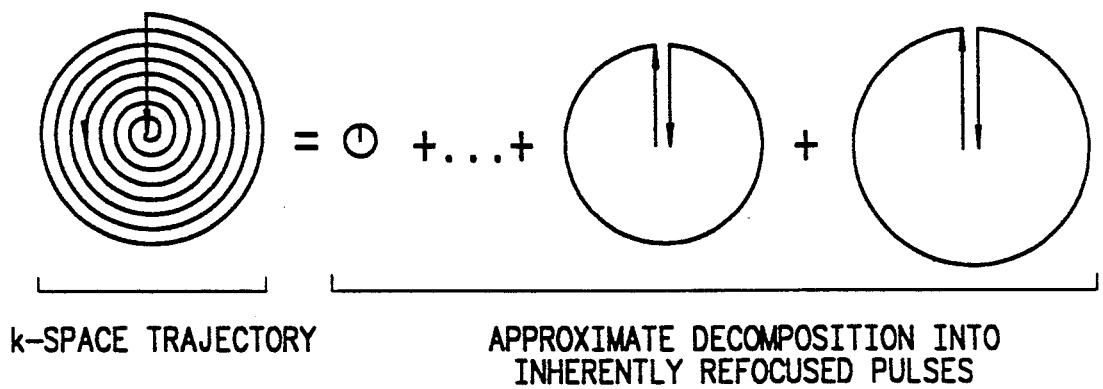
FIG. 8 is an approximate decomposition of a spiral k-space trajectory into inherently refocused component k-space trajectories.

This decomposition is illustrated in FIG. 8 for the case of a round spiral. The actual k-space trajectory is shown on the left. The trajectory spirals outward to the edge of k-space and then blips back in to the middle. The trajectory starts at the k-space origin and covers k-space approximately symmetrically. This trajectory may be approximately decomposed into a sequence of inherently refocused pulses, as is shown on the right of FIG. 8. Each of the component k-space trajectories starts and ends at the origin. RF is applied only during the circular part of the component trajectories, and this part is symmetric about the origin. When concatenating the component trajectories the blips to and from the origin mostly cancel leaving only the initial and final blips, and the small blips going from one circle to the next.

The choice of a particular k-space trajectory will mainly be determined by factors including gradient amplitude and slew-rate limitations, the particular nature of the off-resonance effects for each trajectory, and the beyond the scope of the present paper.

Once the k-space trajectory has been determined, the slice profile may be specified by choosing the RF weighting function. This follows exactly as in Pauly et al., with two conditions. Over the duration of the component inherently refocused pulses the RF should be approximately Hermitian, while the rotation produced should not be too large. In practice these two conditions are not particularly stringent.

As an example we simulated the performance of a constant-angular-rate spiral with a Gaussian slice profile. The k-space trajectory, gradients, and RF used here are simply a time reversed version of the two-dimensional selective excitation pulse. The k-space trajectory and the desired k-space weighting are $$k_x(t) = \frac{At}{T} \cos \frac{2\pi n t}{T} \quad [39]$$

$$k_y(t) = \frac{At}{T} \sin \frac{2\pi n t}{T} \quad [40]$$

$$W(k) = a e^{-(\frac{b|k|}{A})^2}. \quad [41]$$

A determines the area of k-space covered, n is the number of cycles in the spiral, T is the duration of the pulse, a scales the tip angle, and b determines the slice width. The gradient and RF waveforms that will produce this trajectory and weighting are $$G_x(t) = \frac{A}{\gamma T}\left[-\frac{2\pi n t}{T} \sin \frac{2\pi n t}{T} + \cos \frac{2\pi n t}{T}\right] \quad [42]$$

$$G_y(t) = \frac{A}{\gamma T}\left[\frac{2\pi n t}{T} \cos \frac{2\pi n t}{T} + \sin \frac{2\pi n t}{T}\right] \quad [43]$$

$$B_1(t) = \frac{\gamma a A}{T} e^{-(\frac{bt}{T})^2} \sqrt{\left(\frac{2\pi n t}{T}\right)^2 + 1}. \quad [44]$$

Figure 9:
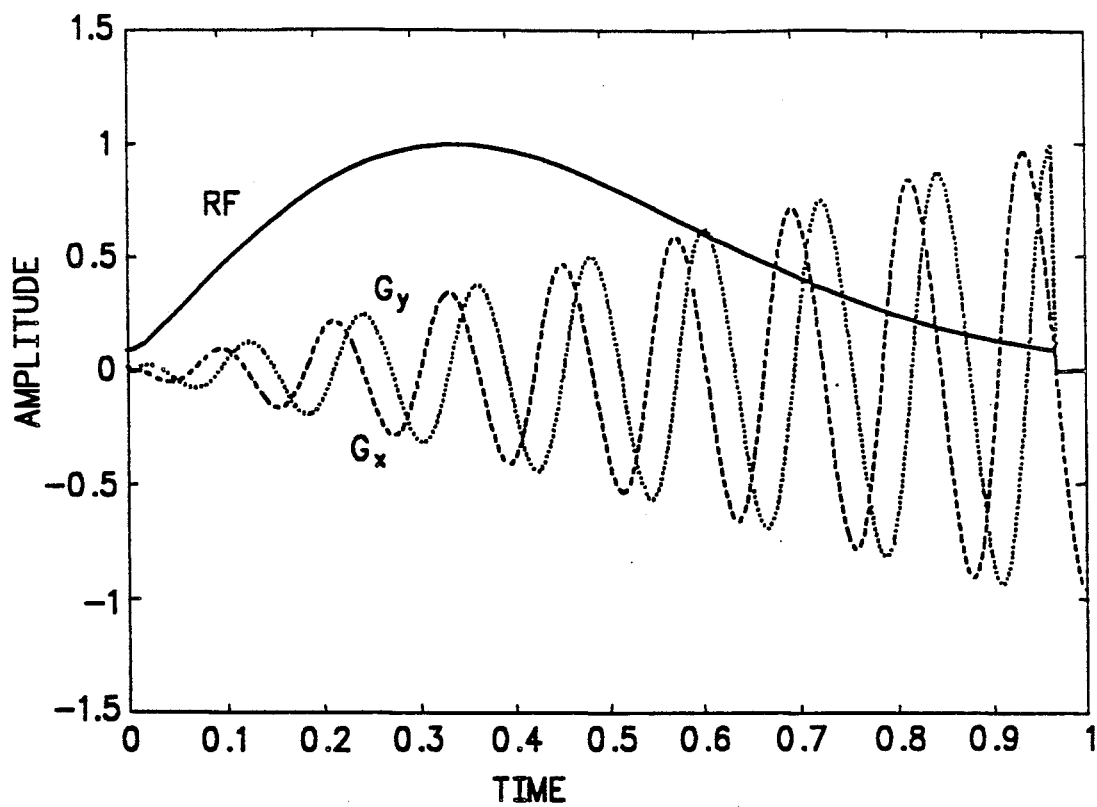
FIG. 9 illustrates Gradient and RF waveforms for a spin-echo $\pi$ pulse.

For the example presented here we used n=8 and b=2. These waveforms are plotted in FIG. 9. The x gradient continues after the end of the RF to shift the k-space origin back to the middle of the spiral.

Figure 10A:
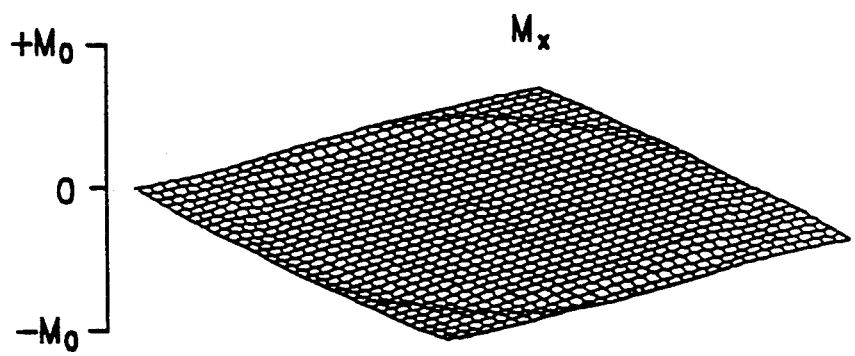
FIGS. 10A–10C are simulated responses to the pulse given in FIG. 9 where the initial magnetization is along the +y axis.
Figure 10B:
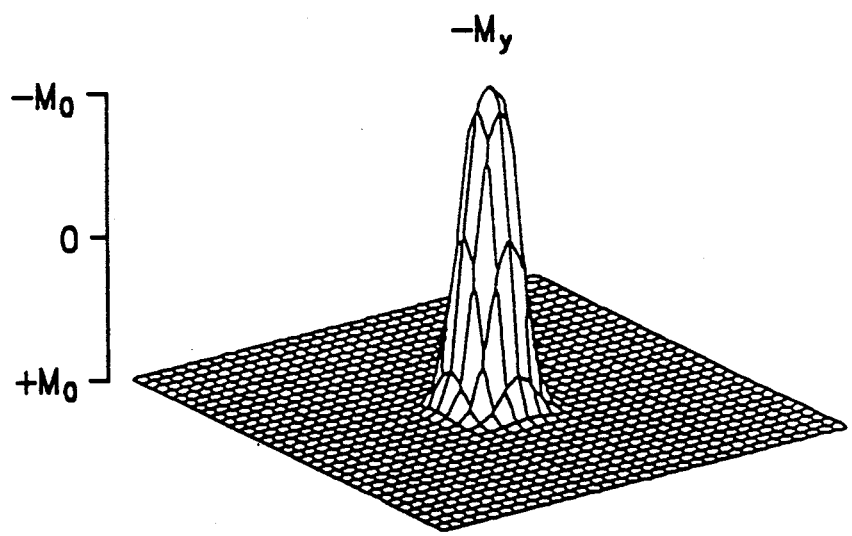
Figure 10C:
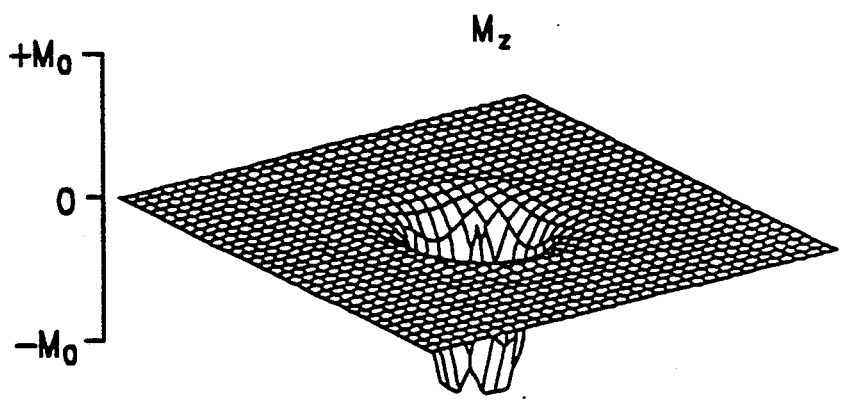

The slice profile of this pulse is illustrated in FIG. 10. These plots were calculated by a numerical integration of the Bloch equation. The initial condition is a magnetization aligned with the +y axis. For visibility $-M_y$ has been plotted. Note that the pulse produces almost no $M_x$. The peak $M_x$ amplitude is on the order of 5%. The pulse does in fact perform rotation about the +x axis. Also note that outside the selective volume the magnetization is left unperturbed. This means the pulse can be used in a two-dimensional analog of multi-slice.

The two-dimensional spin-echo pulse of the previous section was implemented on a 1.5T GE Signa system to demonstrate its technical feasibility. In this section we first describe the pulse sequence and present an image of the resulting selected volume. Then we show that a strictly linear analysis very accurately predicts the slice profile actually observed.

Figure 11:
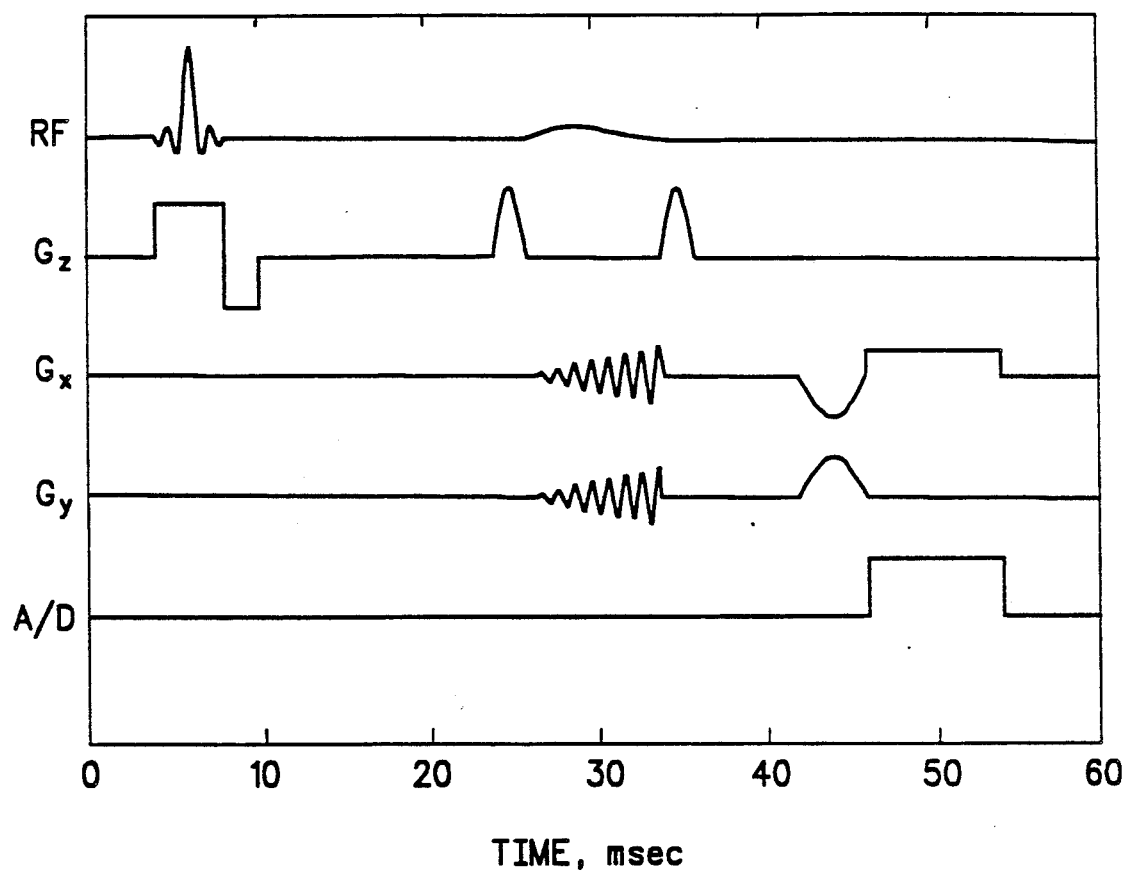
FIG. 11 illustrates the pulse sequence used to experimentally verify the performance of the two-dimension spin-echo $\pi$ pulse.

The pulse sequence is illustrated in FIG. 11. An initial $\pi/2$ pulse excites an axial slice. A spin-echo is formed of a circular region of this slice. An image of this region is obtained using a standard spin-warp gradient sequence.

Figure 13:
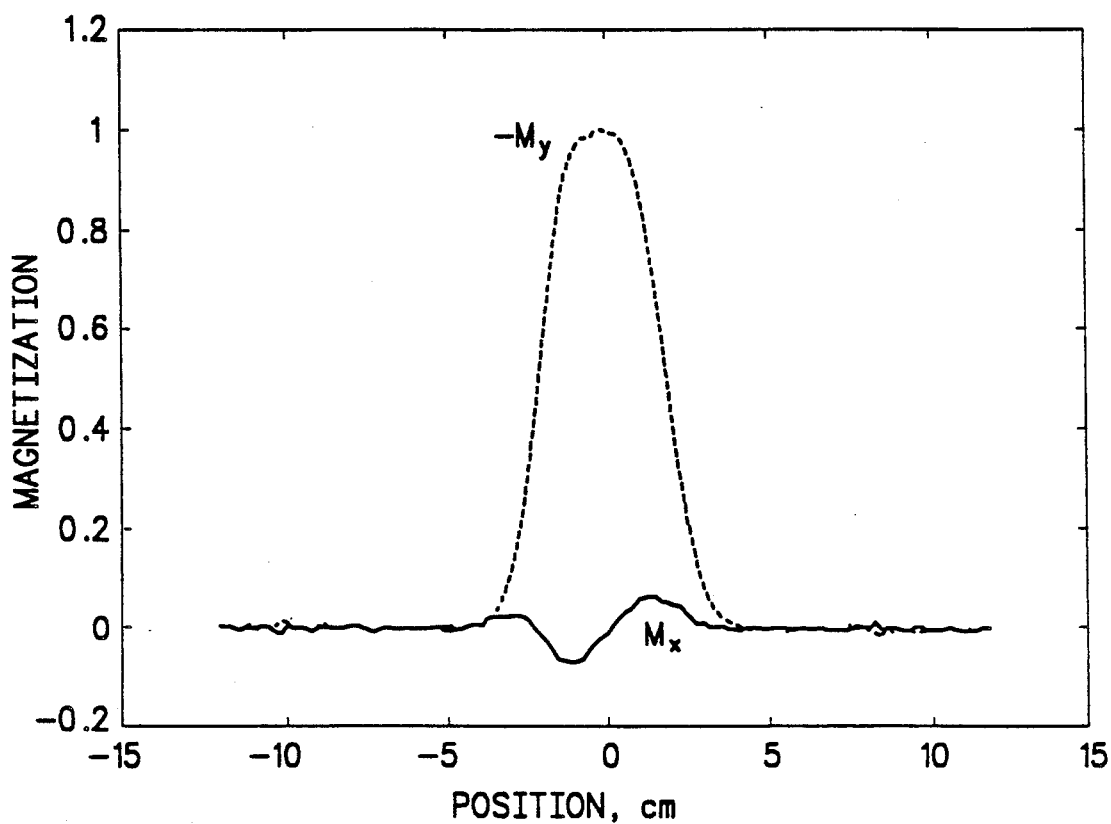
FIG. 13 illustrates a profile taken along the y axis of FIGS. 12A and 12B.

The real and imaginary parts of the resulting image are shown in FIG. 12. A cross section through the middle of the volume is also plotted in FIG. 13. A small linear phase term introduced by the precise position of the echo in the read-out window has been removed in post-processing. The z slice thickness is 1 cm, the circular region is 4 cm in diameter, and the field-of-view is 24 cm. The spiral gradients are played for 8 msec with a maximum amplitude of 0.4 G/cm. The phantom is a sphere filled with water doped with $CuSO_4$ to a $T_2$ of 200 msec.

We now consider the issue of how well this experimental slice profile conforms to the slice profile that would be predicted by a strictly linear analysis. Here we do not use numerical integration of the Bloch equation. Rather, we calculate the expected slice profile assuming that the two-dimensional spin-echo pulse does in fact produce a
rotation about the +x axis, with a rotation angle proportional to the Fourier transform of the weighted k-space trajectory.

Following the slice selective $\pi/2$ pulse the magnetization vector is aligned with the +y axis. The magnetization then experiences a crusher gradient, the spin-echo pulse, and then another crusher gradient. The resulting magnetization may be calculated as $$M^+ = \int_{-\infty}^{\infty} R_x(\omega_z z) R_x(\phi) R_x(\omega_z z) M^- dz. \quad [45]$$

where $R_x(\theta)$ is a rotation by an angle $\theta$ about the x axis, and $M^-$ is $(0, M_o, 0)$, the magnetization immediately preceding the first crusher gradient. $\omega_z$ is the crusher gradient lobe area $$\omega_z = \frac{2}{\pi} \gamma G_c T_c \quad [46]$$

where $G_c$ and $T_c$ are the crusher gradient amplitude and duration. $R_z(\omega_z z)$ can be written $$R_z(\omega_z z) = \begin{pmatrix} \cos\omega_z z & -\sin\omega_z z & 0 \\ \sin\omega_z z & \cos\omega_z z & 0 \\ 0 & 0 & 1 \end{pmatrix} \quad [47]$$

while $R_x(\phi)$ can be written $$R_x(\phi) = \begin{pmatrix} 1 & 0 & 0 \\ 0 & \cos\phi & -\sin\phi \\ 0 & \sin\phi & \cos\phi \end{pmatrix} \quad [48]$$

Carrying out the matrix multiplications $$M^+ = \begin{pmatrix} -\frac{1}{2}(1+\cos\phi)\int_{-\infty}^{\infty} \sin 2\omega_z z \, dz \\ -\int_{-\infty}^{\infty} \sin^2\omega_z z \, dz + \cos\phi \int_{-\infty}^{\infty} \cos^2\omega_z z \, dz \\ \sin\phi \int_{-\infty}^{\infty} \cos\omega_z z \, dz \end{pmatrix} M_o, \quad [49]$$

where we have used the fact that $\phi$ is a function only of x and y, and not of z. After performing the integrations, $$M^+ = \begin{pmatrix} 0 \\ -\frac{1}{2} + \frac{1}{2}\cos\phi \\ 0 \end{pmatrix} M_0. \quad [50]$$

The spatial frequency weighting produced by the two-dimensional spin-echo pulse is a radial Gaussian function scaled to produce a $\pi$ radian rotation on resonance. The tip angle produced by this pulse along a spatial radius r is then $$\phi(r) = \pi e^{-(\frac{r}{s})^2} \quad [51]$$

where s is a spatial scaling factor. By evaluating the Fourier transform of Eq. 41 s may be computed to be $$s = \frac{4\pi nb}{\gamma |G| T} \quad [52]$$

$$= 2.35 \text{ cm} \quad [53]$$

for the experimental parameters used here. The net magnetization following the spin-echo pulse and the crusher gradients is then entirely along $M_y$ with $$M_y^+ = \left[ -\frac{1}{2} + \frac{1}{2}\cos(\pi e^{-(\frac{r}{s})^2}) \right] M_0. \quad [54]$$

Figure 14:
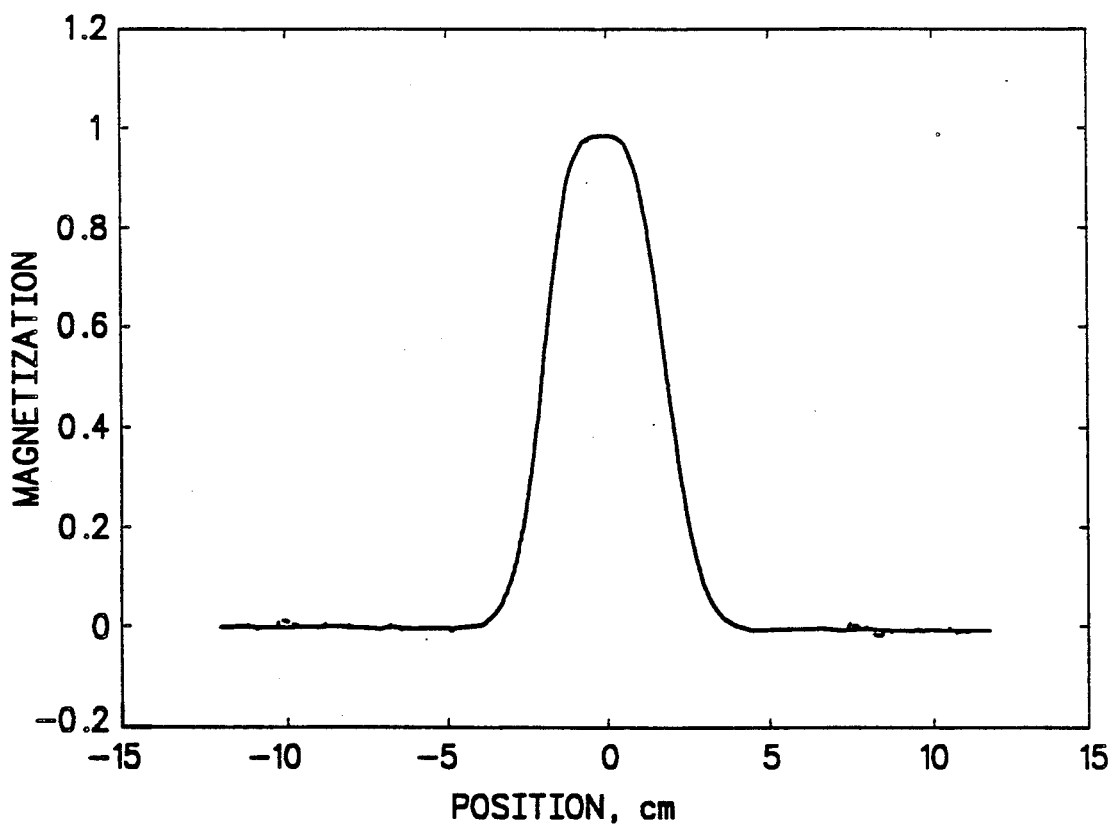
FIG. 14 illustrates a comparison of $-M_y$ for the experimental profile (dashed line) with that predicted by a strictly linear analysis (solid line).

This function is plotted along with $M_y$ from the experimental profile in FIG. 14.

The agreement between the experimental profile and the linear calculation of the profile is very good. Using this linear analysis it is possible not only to design large-tip-angle pulses, but also to quite accurately predict their performance analytically.

There are a wide range of potential applications for the two-dimensional selective excitation pulses as proposed here. The utility of these pulses in a particular application depends largely on the range of off-resonance frequencies, and the gradient power available. With current hardware at 1.5 T many potential applications can be immediately addressed. Two of these are field-of-view restriction for fast imaging and selective flow tagging. The factor currently limiting the general utility of these pulses is their off-resonance behavior. This is not a fundamental limitation. Off-resonance effects can be overcome with gradient power. Much higher gradient power is possible with the resonant gradient systems that are now being proposed, designed, and built. The gradient waveforms associated with spiral k-space trajectory, for example, are particularly well suited to implementation on resonant systems.

There has been presented a class of selective excitation pulses that can be designed using linear Fourier transform analysis, even for large tip angles. Using this method pulses may be analytically designed for selective excitation, inversion, or spin-echo formation. This method is of the greatest utility in designing two-dimensional pulses, although it applies in general. The two dimensional pulses in particular have many immediate applications on current hardware. Their suitability for implementation on resonant gradient systems will enhance their utility as these systems becomes available.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. A method of generating a linear large tip-angle selective excitation pulse for magnetic resonance imaging comprising the steps of
   defining a small tip-angle excitation pulse which produces a rotation of nuclear spins about an axis,
   producing a sequence of said small tip-angle excitation pulses, and
   concatenating said sequence of small tip angle excitation pulses whereby the sum of the tip angles produced by said sequence of pulses produces a desired net large tip-angle.

2. The method as defined by claim 1 where the rotation produced by the $j^{th}$ small tip-angle pulse is $$\phi_j = \gamma \int_{T_{j-1}}^{T_j} B_1^*(t) e^{-ix \cdot k_j(t)} dt$$

where $\gamma$ is the gyromagnetic ratio, B* is the conjugate of RF field produced by said pulses, T is the duration of said pulses, the $j^{th}$ pulse starts at the time $T_{j-1}$ and ends at time $T_j$, and where $k_j(t)$ is defined as $$k_j(t) = -\gamma \int_t^{T_j} G(s) ds$$

where G(s) is a magnetic gradient as a function of the variable s, and the tip angle resulting from the concentration of pulses is $$\phi = \sum_{j=1}^{n} \phi_j$$
$$= \sum_{j=1}^{n} \gamma \int_{T_{j-1}}^{T_j} B_1^*(t) e^{-ix \cdot k_j(t)} dt$$
$$= \gamma \int_0^T B_1^*(t) e^{-ix \cdot k(t)} dt.$$

3. The method as defined by claim 2 wherein said large tip-angle pulse is a two-dimensional spin-echo pi pulse in which the k-space trajectory and k-space weighting are $$k_x(t) = \frac{At}{T} \cos \frac{2\pi nt}{T}$$

$$k_y(t) = \frac{At}{T} \sin \frac{2\pi nt}{T}$$

$$W(k) = ae^{-(\frac{b|k|}{A})^2}$$

where A determines the area of k-space covered, n is the number of cycles in a spiral of the k-space trajectory, T is the duration of the pulse, a scales the tip angle, and b determines a slice width which is selectively excited or refocused.

4. The method as defined by claim 3 wherein the gradient and RF waveforms to produce said k-space trajectory and k-space weighting are $$G_x(t) = \frac{A}{\gamma T}\left[-\frac{2\pi nt}{T}\sin\frac{2\pi nt}{T} + \cos\frac{2\pi nt}{T}\right]$$

$$G_y(t) = \frac{A}{\gamma T}\left[\frac{2\pi nt}{T}\cos\frac{2\pi nt}{T} + \sin\frac{2\pi nt}{T}\right]$$

$$B_1(t) = \frac{\gamma \alpha A}{T} e^{-(\frac{bt}{T})^2} \sqrt{\left(\frac{2\pi nt}{T}\right)^2 + 1}.$$

* * * * *